(12) United States Patent
Kim et al.

(10) Patent No.: US 11,935,772 B2
(45) Date of Patent: Mar. 19, 2024

(54) APPARATUS FOR PROCESSING A SUBSTRATE

(71) Applicant: Samsung Electronics Co., Ltd., Suwon-si (KR)

(72) Inventors: Seohyun Kim, Hwaseong-si (KR); Younghoo Kim, Yongin-si (KR); Sangjine Park, Suwon-si (KR); Kuntack Lee, Suwon-si (KR); Jihoon Jeong, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 163 days.

(21) Appl. No.: 17/381,507

(22) Filed: Jul. 21, 2021

(65) Prior Publication Data
US 2022/0199440 A1 Jun. 23, 2022

(30) Foreign Application Priority Data
Dec. 17, 2020 (KR) ........................ 10-2020-0177260

(51) Int. Cl.
*H01L 21/677* (2006.01)
(52) U.S. Cl.
CPC .. *H01L 21/67703* (2013.01); *H01L 21/67739* (2013.01)
(58) Field of Classification Search
CPC .............. B25J 19/0058; B25J 19/023; H01L 21/67173; H01L 21/67703; H01L 21/67739; H01L 21/6776
See application file for complete search history.

(56) References Cited

U.S. PATENT DOCUMENTS

| | | | |
|---|---|---|---|
| 8,585,831 B2 | 11/2013 | Matsui et al. | |
| 8,944,078 B2 | 2/2015 | Kamikawa | |
| 8,991,333 B2* | 3/2015 | Tozawa | H01L 21/67173 |
| | | | 156/345.31 |
| 9,236,272 B2* | 1/2016 | Moriya | H01L 21/3065 |
| 9,627,233 B2 | 4/2017 | Kim et al. | |
| 10,679,843 B2 | 6/2020 | Jeong et al. | |
| 10,692,739 B2 | 6/2020 | Kawabuchi et al. | |
| 2003/0230385 A1* | 12/2003 | Bach | H01L 21/67207 |
| | | | 156/345.31 |

(Continued)

FOREIGN PATENT DOCUMENTS

KR 101664784 B1 10/2016
KR 20180076691 A 7/2018

*Primary Examiner* — Saul Rodriguez
*Assistant Examiner* — Brendan P Tighe
(74) *Attorney, Agent, or Firm* — Myers Bigel, P.A.

(57) ABSTRACT

An apparatus for processing a substrate may include a wet chamber, a dry chamber, a first transfer robot and a shared shutter. The wet chamber may be configured to process the substrate using a chemical. The dry chamber may be adjacent the wet chamber and configured to dry the substrate processed by the wet chamber. The first transfer robot may be configured to transfer the substrate between the wet chamber and the dry chamber. The shared shutter may be between the wet chamber and the dry chamber. A connection opening through which the substrate may be transferred may be formed between the wet chamber and the dry chamber. The shared shutter may be configured to open and close the connection opening.

18 Claims, 7 Drawing Sheets

(56) References Cited

U.S. PATENT DOCUMENTS

| | | | | |
|---|---|---|---|---|
| 2004/0262254 | A1* | 12/2004 | Ozawa | H01L 21/67173 |
| | | | | 216/2 |
| 2006/0130751 | A1* | 6/2006 | Volfovski | H01L 21/67109 |
| | | | | 118/300 |
| 2006/0134536 | A1* | 6/2006 | Herchen | H01L 21/6715 |
| | | | | 430/30 |
| 2006/0241813 | A1* | 10/2006 | Babu | H01L 21/67173 |
| | | | | 700/255 |
| 2008/0145191 | A1* | 6/2008 | Salinas | H01L 21/67109 |
| | | | | 414/217 |
| 2009/0301525 | A1* | 12/2009 | Ozawa | H01L 21/67201 |
| | | | | 134/21 |
| 2011/0035957 | A1* | 2/2011 | Muraki | H01L 21/67748 |
| | | | | 34/236 |
| 2013/0166061 | A1* | 6/2013 | Yamamoto | B25J 9/1697 |
| | | | | 700/214 |
| 2015/0170931 | A1* | 6/2015 | Suemasa | H01L 21/31111 |
| | | | | 438/706 |
| 2017/0132807 | A1* | 5/2017 | Shivaram | G06T 7/80 |
| 2018/0160016 | A1* | 6/2018 | Yamane | B08B 17/04 |
| 2019/0013207 | A1* | 1/2019 | Kobayashi | H01L 21/02063 |
| 2020/0210700 | A1* | 7/2020 | Oka | B25J 9/1661 |
| 2020/0246723 | A1 | 8/2020 | Goshi | |
| 2021/0331311 | A1* | 10/2021 | Fu | B25J 9/1605 |

* cited by examiner

APPARATUS FOR PROCESSING A SUBSTRATE

CROSS-RELATED APPLICATION

This application claims priority under 35 USC § 119 to Korean Patent Application No. 10-2020-0177260, filed on Dec. 17, 2020 in the Korean Intellectual Property Office (KIPO), the contents of which are herein incorporated by reference in their entirety.

BACKGROUND

Example embodiments relate to an apparatus for processing a substrate. More particularly, example embodiments relate to an apparatus for processing a semiconductor substrate using a chemical.

Generally, a photoresist pattern may be formed by exposing a photoresist film on a semiconductor substrate, and by developing the exposed photoresist film in a wet chamber using a chemical such as a developing solution. The chemical remaining on the photoresist pattern may be removed by a dry process performed in a dry chamber.

According to related arts, a transfer robot may transfer the semiconductor substrate with the photoresist pattern from the wet chamber to the dry chamber. An entrance through which the semiconductor substrate may pass may be formed at a sidewall, which may be oriented toward a same direction, among sidewalls of each of the wet chamber and the dry chamber. Thus, a time for transferring the semiconductor substrate from the wet chamber to the dry chamber by the transfer robot may be long. Further, during transferring the semiconductor substrate, the photoresist pattern and the chemical may be exposed to atmosphere for a long time. The exposed photoresist pattern and the exposed chemical may be partially evaporated to generate fumes. The fumes may act as a contaminant in a space between the wet chamber and the dry chamber.

SUMMARY

Example embodiments provide an apparatus for processing a substrate that may be capable of reducing a transfer time of the substrate between a wet chamber and a dry chamber.

According to example embodiments, there may be provided an apparatus for processing a substrate. The apparatus may include a wet chamber, a dry chamber, a first transfer robot and a shared shutter. The wet chamber may be configured to process the substrate using a chemical. The dry chamber may be adjacent the wet chamber and configured to dry the substrate processed by the wet chamber. The first transfer robot may be configured to transfer the substrate between the wet chamber and the dry chamber. The shared shutter may be between the wet chamber and the dry chamber. A connection opening through which the substrate may be transferred may be formed between the wet chamber and the dry chamber. The shared shutter may be configured to open and close the connection opening.

According to example embodiments, there may be provided an apparatus for processing a substrate. The apparatus may include a wet chamber, a dry chamber, a first transfer robot and a shared shutter. The wet chamber may be configured to process the substrate using a chemical. The dry chamber may share one sidewall with the wet chamber. A connection opening may be formed through the shared sidewall. The dry chamber may be configured to dry the substrate transferred through the connection opening. The first transfer robot may be configured to transfer the substrate from the wet chamber to the dry chamber through the connection opening. The shared shutter may be configured to selectively open and close the connection opening.

According to example embodiments, there may be provided an apparatus for processing a substrate. The apparatus may include a wet chamber, a dry chamber, a first transfer robot and a shared shutter. The wet chamber may be configured to process the substrate using a chemical. The dry chamber may be configured to dry the substrate processed by the wet chamber. The first transfer robot may be configured to transfer the substrate from the wet chamber to the dry chamber. The shared shutter may be between the wet chamber and the dry chamber. A first connection opening may be formed through a sidewall of the wet chamber that is adjacent the dry chamber. A second connection opening may be formed through a sidewall of the dry chamber that is adjacent the wet chamber. The shared shutter may be configured to open and close the first and second connection openings.

According to example embodiments, the connection opening may be formed through the shared sidewall or adjacent sidewalls facing each other of the wet chamber and the dry chamber. The first transfer robot may transfer the substrate between the wet chamber and the dry chamber through the connection opening. Thus, an exposure time of the substrate to the atmosphere during transferring the substrate from the wet chamber to the dry chamber may be remarkably reduced to decrease generation of contaminants from the chemical.

BRIEF DESCRIPTION OF THE DRAWINGS

Example embodiments will be more clearly understood from the following detailed description taken in conjunction with the accompanying drawings.

FIG. 1 is a plan view illustrating an apparatus for processing a substrate in accordance with example embodiments;

FIGS. 2 and 3 are a perspective view and a plan view illustrating operations for loading the substrate into a wet chamber of the apparatus in FIG. 1;

FIGS. 4 and 5 are a perspective view and a plan view illustrating operations for loading the substrate into a dry chamber from a wet chamber of the apparatus in FIG. 1;

FIG. 6 is a perspective view illustrating a vision camera installed at a first transfer robot in FIG. 2;

FIG. 7 is a view illustrating a side surface of the substrate photographed by the vision camera in FIG. 6;

FIG. 8 is a view illustrating an inner wall of a wet chamber photographed by the vision camera in FIG. 6;

FIG. 9 is a plan view illustrating an apparatus for processing a substrate in accordance with example embodiments;

FIG. 10 is a plan view illustrating an apparatus for processing a substrate in accordance with example embodiments;

FIG. 11 is a perspective view illustrating operations for transferring the substrate between a wet chamber and a dry chamber of the apparatus in FIG. 10;

FIG. 12 is a plan view illustrating operations for loading the substrate into a wet chamber of the apparatus in FIG. 10; and FIG. 13 is a plan view illustrating operations for loading the substrate into a dry chamber from a wet chamber of the apparatus in FIG. 10.

DETAILED DESCRIPTION

Hereinafter, example embodiments will be explained in detail with reference to the accompanying drawings.

Figure 1:
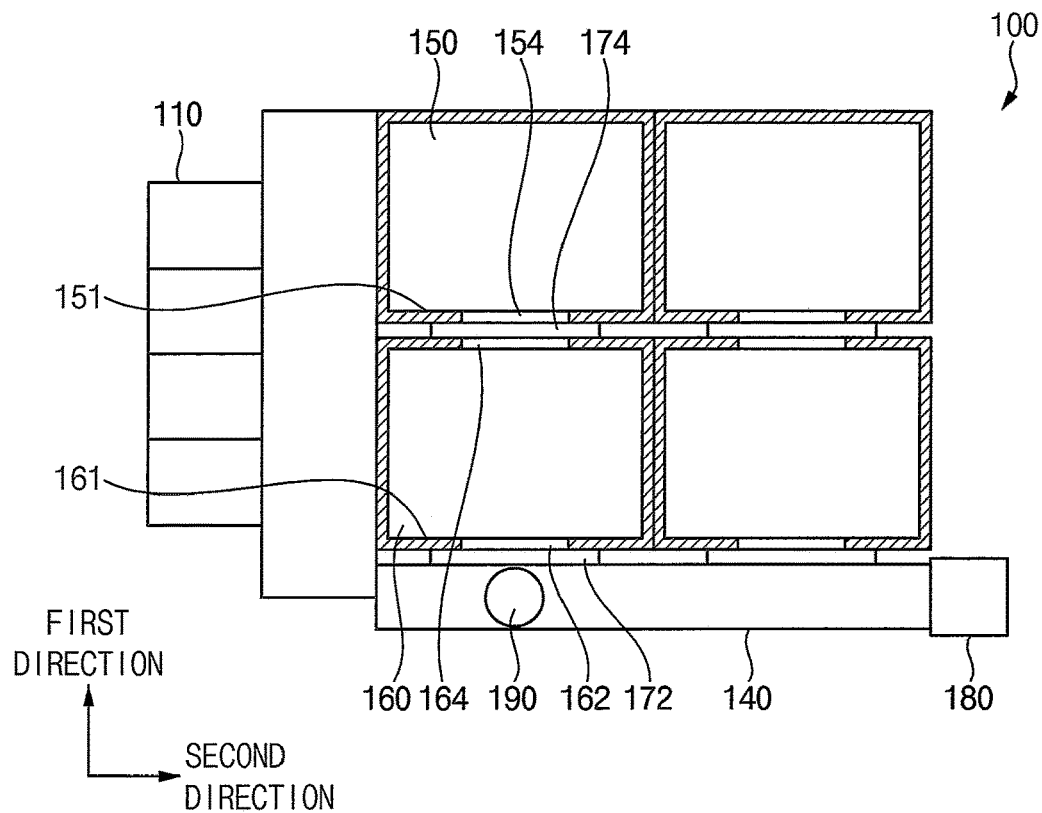
FIGS. 1 to 13 represent non-limiting, example embodiments as described herein.

FIG. 1 is a plan view illustrating an apparatus for processing a substrate in accordance with example embodiments.

An apparatus 100 for processing a substrate in accordance with example embodiments may be used for a process for forming a photoresist pattern on a semiconductor substrate using a chemical. The photoresist pattern may be formed by an exposing process performed on a photoresist film on the semiconductor substrate, a developing process performed on the exposed photoresist film in a wet chamber 150 using a developing solution, and a drying process for drying the developing solution remaining on the photoresist film in a dry chamber 160. The apparatus 100 of example embodiments may be used for the developing process and the drying process.

Alternatively, the apparatus 100 of example embodiments may be used for a wet etching process for etching a layer on the semiconductor substrate using an etching solution, a cleaning process for cleaning the semiconductor substrate using a cleaning solution, etc.

Referring to FIG. 1, the apparatus 100 for processing a substrate in accordance with example embodiments may include a standby region 110, an unloading region 140, a wet chamber 150, a dry chamber 160, a first transfer robot 190, a sharing shutter or shared shutter 174 and an unloading shutter 172.

The semiconductor substrate with an exposed photoresist film may be on standby in the standby region 110. The wet chamber 150 and the dry chamber 160 may be located to the right of the standby region 110 as shown in FIG. 1. When the chemical may include the developing solution, the dry chamber 160 may include a supercritical dry chamber.

Each of the wet chamber 150 and the dry chamber 160 may have a rectangular planar shape. Thus, each of the wet chamber 150 and the dry chamber 160 may have four sidewalls. However, the wet chamber 150 and the dry chamber 160 may have various other shapes, and are not limited thereto.

The wet chamber 150 and the dry chamber 160 may be arranged in a first direction. Particularly, the wet chamber 150 and the dry chamber 160 may be arranged adjacent to each other. Thus, the wet chamber 150 and the dry chamber 160 may have adjacent sidewalls 151 and 161. That is, the adjacent sidewall 151 of the wet chamber 150 may face the adjacent sidewall 161 of the dry chamber 160.

In example embodiments, a gap between the adjacent sidewalls 151 and 161 of the wet chamber 150 and the dry chamber 160 may be very narrow. Alternatively, the gap may not exist between the adjacent sidewalls 151 and 161 of the wet chamber 150 and the dry chamber 160. That is, the adjacent sidewall 151 of the wet chamber 150 may make contact with the adjacent sidewall 161 of the dry chamber 160.

A first connection opening 154 may be formed through the adjacent sidewall 151 of the wet chamber 150. The first connection opening 154 may have a size for allowing the semiconductor substrate and the first transfer robot to pass therethrough.

A second connection opening 164 may be formed through the adjacent sidewall 161 of the dry chamber 160. Because the adjacent sidewall 161 of the dry chamber 160 may face the adjacent sidewall 151 of the wet chamber 150, the first connection opening 154 and the second connection opening 164 may face to each other in the first direction. The second connection opening 164 may have a size the same or similar to the size of the first connection opening 154. Thus, the semiconductor substrate and the first transfer robot 190 may be moved through the second connection opening 164.

The sharing shutter 174 may be arranged between the adjacent sidewalls 151 and 161 of the wet chamber 150 and the dry chamber 160. The sharing shutter 174 may be configured to open and close the first connection opening 154 and the second connection opening 164. Particularly, during the developing process and the drying process that may be performed in the wet chamber 150 and the dry chamber 160, the sharing shutter 174 may close the first connection opening 154 and the second connection opening 164. When the semiconductor substrate may be loaded into the wet chamber 150 or unloaded from the wet chamber 150, the sharing shutter 174 may open the first connection opening 154 and the second connection opening 164. Alternatively, two sharing shutters 174 may independently open and close the first connection opening 154 and the second connection opening 164, respectively.

The dry chamber 160 may include an unloading opening 162. The unloading opening 162 may be formed through the sidewall among the total sidewalls of the dry chamber 160 opposite to the adjacent sidewall 161. Thus, the unloading opening 162 and the second connection opening 164 may be positioned or aligned in the first direction. The unloading opening 162 may have a size for allowing the semiconductor substrate and the first transfer robot 190 to pass therethrough.

The unloading region 140 may be arranged at a front of the unloading opening 162 of the dry chamber 160 in a second direction substantially perpendicular to the first direction. An unloading shutter 172 may be arranged at the front of the unloading opening 162 to open and close the unloading opening 162.

The first transfer robot 190 may be arranged in the unloading region 140. The first transfer robot 190 may be moved in the unloading region 140 along the second direction. Further, the first transfer robot 190 may be moved from the unloading region 140 into the dry chamber 160 and the wet chamber 150 along the first direction. A first cleaner 180 for cleaning the first transfer robot 190 may be arranged at a side of the unloading region 140.

The first transfer robot 190 may receive the semiconductor substrate in the standby region 110. The first transfer robot 190 may load the semiconductor substrate into the wet chamber 150 through the dry chamber 160. Further, the first transfer robot 190 may load the semiconductor substrate processed by the chemical from the wet chamber 150 into the dry chamber 160. The first transfer robot 190 may unload the dried semiconductor substrate from the dry chamber 160 into the unloading region 140. Therefore, the first transfer robot 190 may have a summed length of a length of the dry chamber 160 and a length of the wet chamber 150 along the second direction.

That is, the first transfer robot 190 may function as to load the semiconductor substrate into the wet chamber 150 as well as unload the semiconductor substrate from the wet chamber 150 and the dry chamber 160. The semiconductor substrate may be loaded into the wet chamber 150 through the unloading opening 162 of the dry chamber 160 and the first and second connection openings 154 and 164 by the first transfer robot 190. Thus, the wet chamber 150 of example embodiments may not include a (separate) loading opening for loading the semiconductor substrate. Therefore, the unloading region 140 may correspond to a region for performing the loading of the semiconductor substrate as well as a region for performing the unloading of the semiconductor substrate.

When the semiconductor substrate transferred from the wet chamber 150 to the dry chamber 160 may be exposed for a long time, the photoresist pattern on the semiconductor substrate and the chemical such as the developing solution may be evaporated to generate a fume. Particularly, the long time exposure may increase a concentration of the fume to increase a generation amount of the fume. The fume may act as a contaminant of the wet chamber 150, the dry chamber 160, the first transfer robot 190 and/or other semiconductor substrates.

However, according to example embodiments, the semiconductor substrate transferred from the wet chamber 150 to the dry chamber 160 by the first transfer robot 190 may be moved through the opened first connection opening 154 and the opened second connection opening 164. As mentioned above, the adjacent sidewalls 151 and 161 of the dry chamber 150 and the wet chamber 160 may be adjacent to each other, and a transfer time of the semiconductor substrate between the wet chamber 150 and the dry chamber 160 may be greatly decreased. Thus, the exposure time of the semiconductor substrate to the atmosphere may also be remarkably reduced or the semiconductor substrate may almost not be exposed to the atmosphere to suppress the generation of the fume from the photoresist pattern and the chemical.

In example embodiments, the wet chamber 150 and the dry chamber 160 in FIG. 1 may be arranged in two rows along the first direction. Alternatively, the wet chamber 150 and the dry chamber 160 in the apparatus 100 may be arranged in one row or at least three rows along the first direction.

Figure 2:
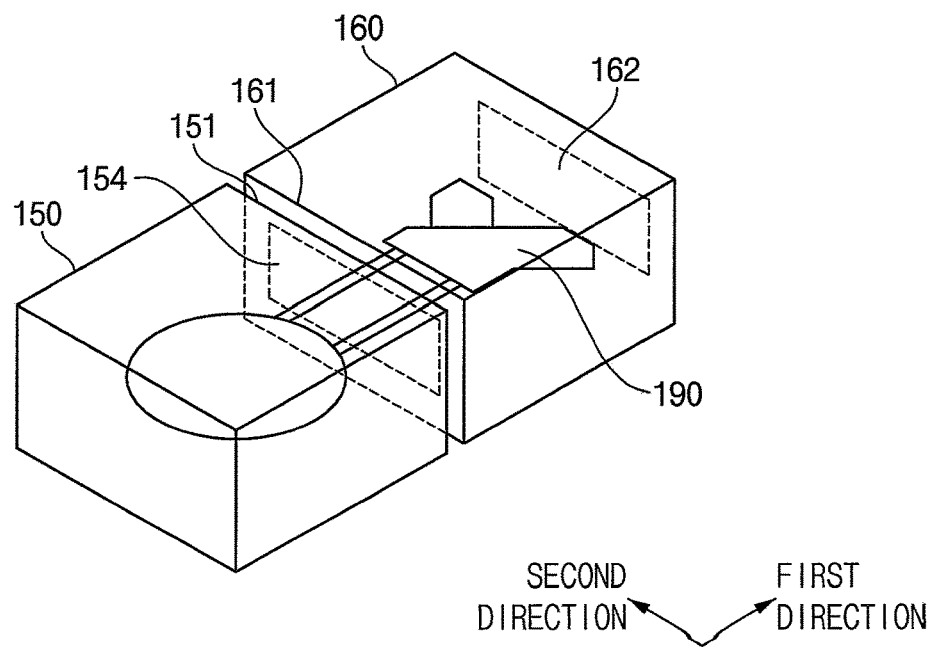
Figure 3:
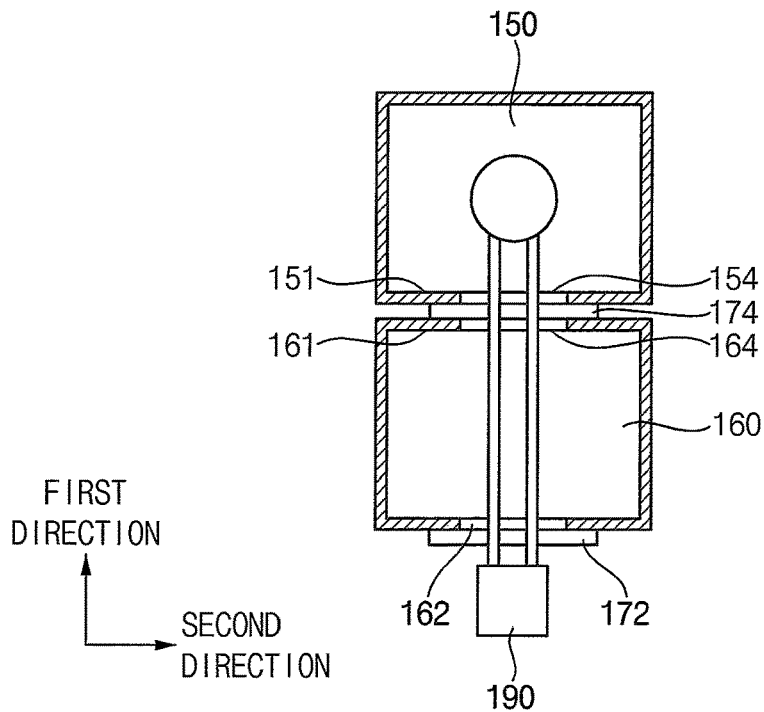

FIGS. 2 and 3 are a perspective view and a plan view illustrating operations for loading the substrate into a wet chamber of the apparatus in FIG. 1.

Referring to FIGS. 2 and 3, the first transfer robot 190 may move into the standby region 110 along the second direction to hold or pick up the semiconductor substrate. The first transfer robot 190 may be positioned at the front of the unloading opening 162 of the dry chamber 160.

The unloading shutter 172 may open the unloading opening 162. The sharing shutter 174 may open the first connection opening 154 and the second connection opening 164. The first transfer robot 190 may be forwardly moved into the wet chamber 150 through the dry chamber 160 to load the semiconductor substrate into the wet chamber 150.

The first transfer robot 190 may be backwardly moved into the dry chamber 160. The sharing shutter 174 may close the first connection opening 154 and the second connection opening 164. The semiconductor substrate in the wet chamber 150 may be processed using the chemical. For example, the wet process including the developing process, the wet etching process, the wet cleaning process, etc., may be performed on the semiconductor substrate.

Figure 4:
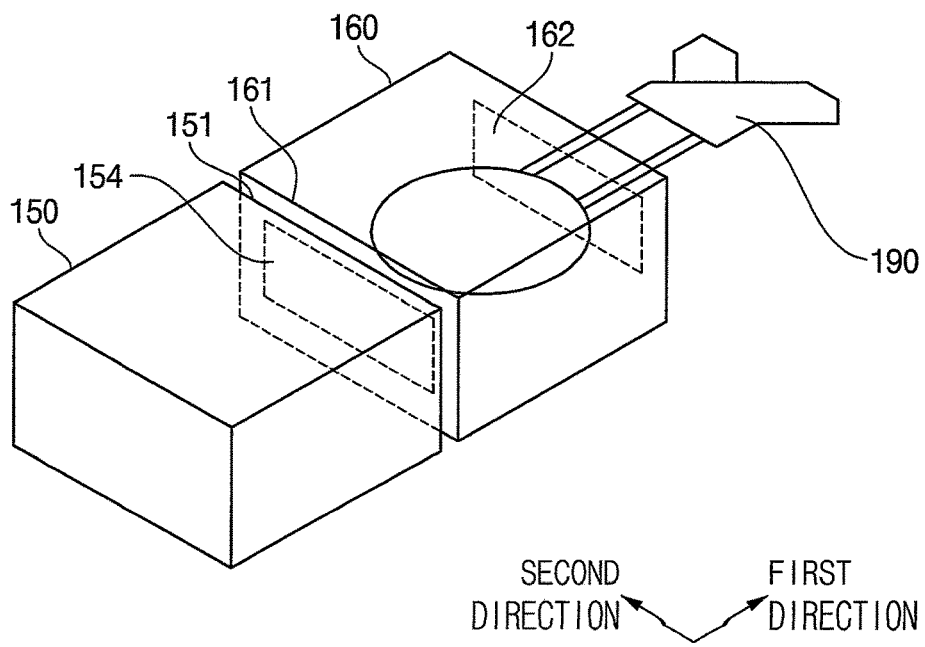
Figure 5:
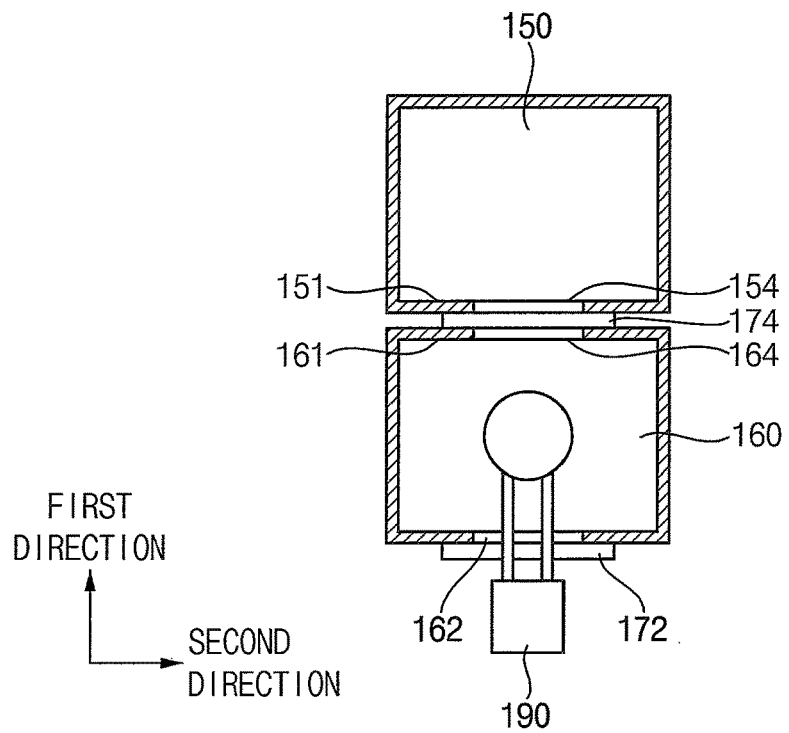

FIGS. 4 and 5 are a perspective view and a plan view illustrating operations for loading the substrate into a dry chamber from a wet chamber of the apparatus in FIG. 1.

Referring to FIGS. 4 and 5, after completing the wet process, the sharing shutter 174 may open the first connection opening 154 and the second connection opening 164.

The first transfer robot 190 may be forwardly moved into the wet chamber 150 to hold or pick up the semiconductor substrate. The first transfer robot 190 may then load the semiconductor substrate into the dry chamber 160 through the first connection opening 154 and the second connection opening 164. The movement of the semiconductor substrate from the wet chamber 150 to the dry chamber 160 may be performed in a very short time so that the exposure time of the semiconductor substrate to the atmosphere may be very short or the semiconductor substrate may almost not be exposed to the atmosphere. Thus, the generation of the fume from the photoresist pattern and the chemical may be suppressed.

The first transfer robot 190 may be backwardly moved through the unloading opening 162. The first transfer robot 190 may then be positioned in the unloading region 140. The unloading shutter 172 may close the unloading opening 162. The drying process may be performed on the semiconductor substrate in the dry chamber 160 to dry the chemical.

After completing the drying process, the unloading shutter 172 may open the unloading opening 162. The first transfer robot 190 may be forwardly moved into the dry chamber 160 to hold or pick up the semiconductor substrate. The first transfer robot 190 may then unload the dried semiconductor substrate into the standby region 110.

Figure 6:
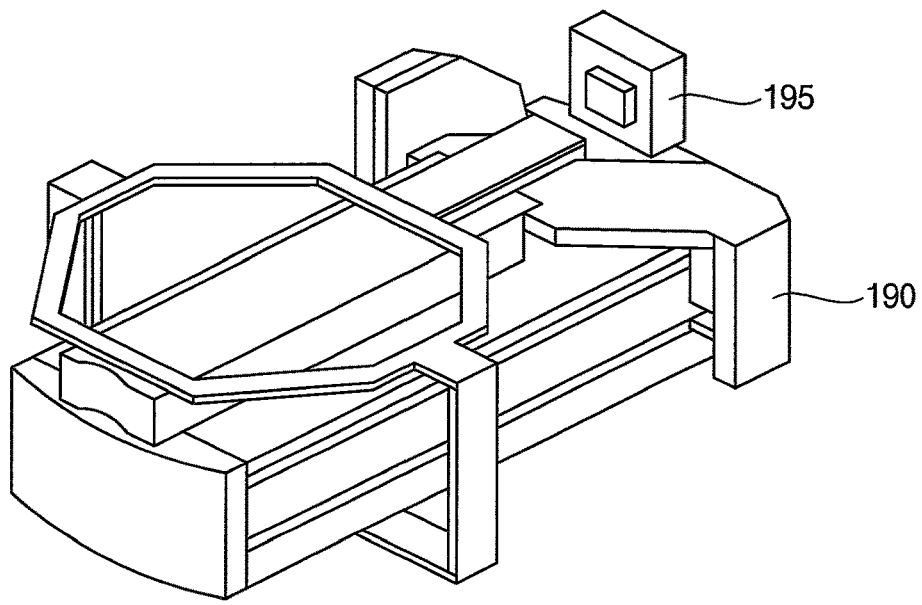
Figure 7:
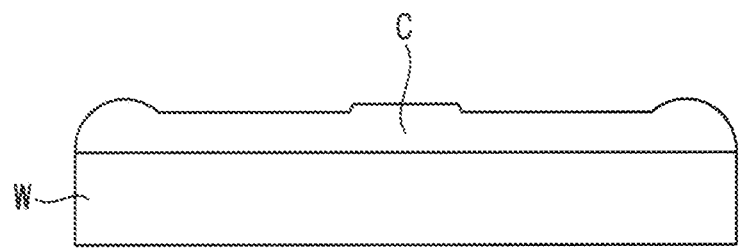
Figure 8:
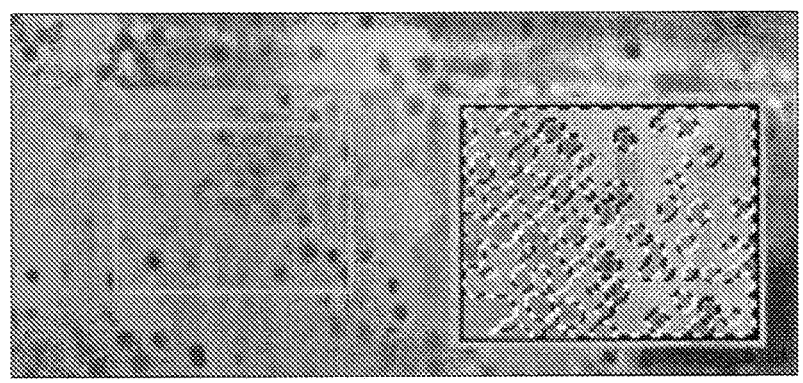

FIG. 6 is a perspective view illustrating a vision camera installed at a first transfer robot in FIG. 2, FIG. 7 is a view illustrating a side surface of the substrate photographed by the vision camera in FIG. 6, and FIG. 8 is a view illustrating an inner wall of a wet chamber photographed by the vision camera in FIG. 6.

Referring to FIG. 6, a vision camera 195 may be installed at or on the first transfer robot 190. Particularly, the vision camera 195 may be installed at or on an upper surface of the first transfer robot 190.

The vision camera 195 may photograph the semiconductor substrate transferred by the first transfer robot 190 to obtain an image. Because the vision camera 195 may be moved together with the first transfer robot 190, the transferred semiconductor substrate may be photographed in real time.

Particularly, as shown in FIG. 7, the vision camera 195 may photograph a side surface of the semiconductor substrate W to obtain a side image of the semiconductor substrate W. The side image of the semiconductor substrate W may include information with respect to a shape of the chemical C distributed on the semiconductor substrate W. A coated amount of the chemical C provided to the semiconductor substrate W may be obtained from the information with respect to the shape of the chemical C. When the obtained coat amount of the chemical C may be beyond an allowable range, an alarm for stopping the wet process may be provided or shown. The wet chamber 150 may then be repaired.

Further, the vision camera 195 may photograph inner walls of the wet chamber 150 and the dry chamber 160 to obtain an image in FIG. 8. The image in FIG. 8 may be shaded to obtain contamination information for a region and a degree of the contaminant on the inner walls of the wet chamber 150 and the dry chamber 160. Thus, based on the contamination information, an additional contamination of the wet chamber 150 and the dry chamber 160 may be prevented, or a cleaning process may be performed on the wet chamber 150 and the dry chamber 160.

Figure 9:
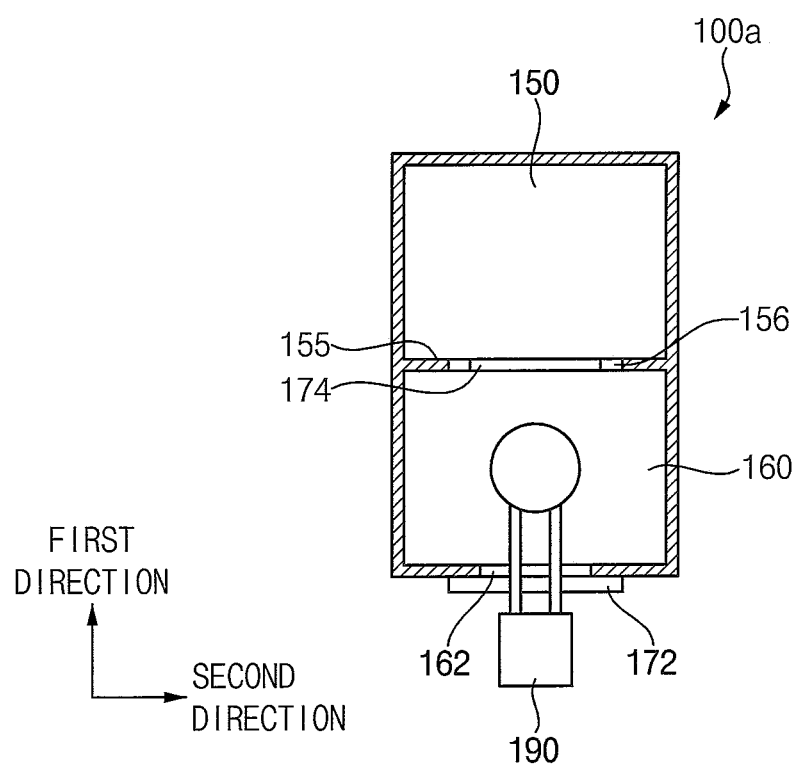

FIG. 9 is a plan view illustrating an apparatus for processing a substrate in accordance with example embodiments.

An apparatus 100a for processing a substrate in accordance with this example embodiment may include elements substantially the same as those of the apparatus 100 in FIG. 1 except for a wet chamber and a dry chamber. Thus, the same reference numerals may refer to the same elements and any further illustrations with respect to the same elements may be omitted herein in the interest of brevity.

Referring to FIG. 9, the wet chamber 150 and the dry chamber 160 may share one sidewall 155. That is, the single sidewall 155 may be arranged between the wet chamber 150 and the dry chamber 160.

Thus, one sharing opening or shared opening 156 may be formed through the sharing sidewall or shared sidewall 155. The sharing opening 156 may have a size for allowing the semiconductor substrate and the first transfer robot 190 to pass therethrough. The sharing shutter or shared shutter 174 may open and close the sharing opening 156.

Figure 10:
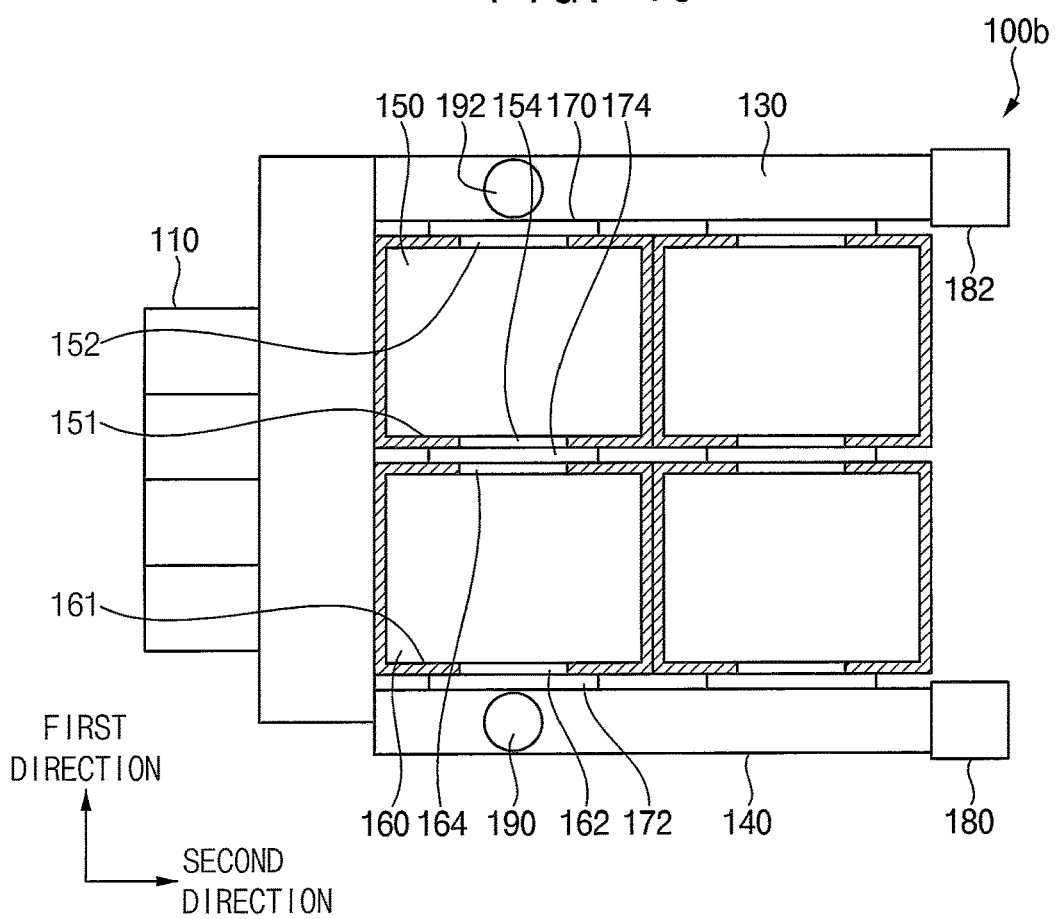
Figure 11:
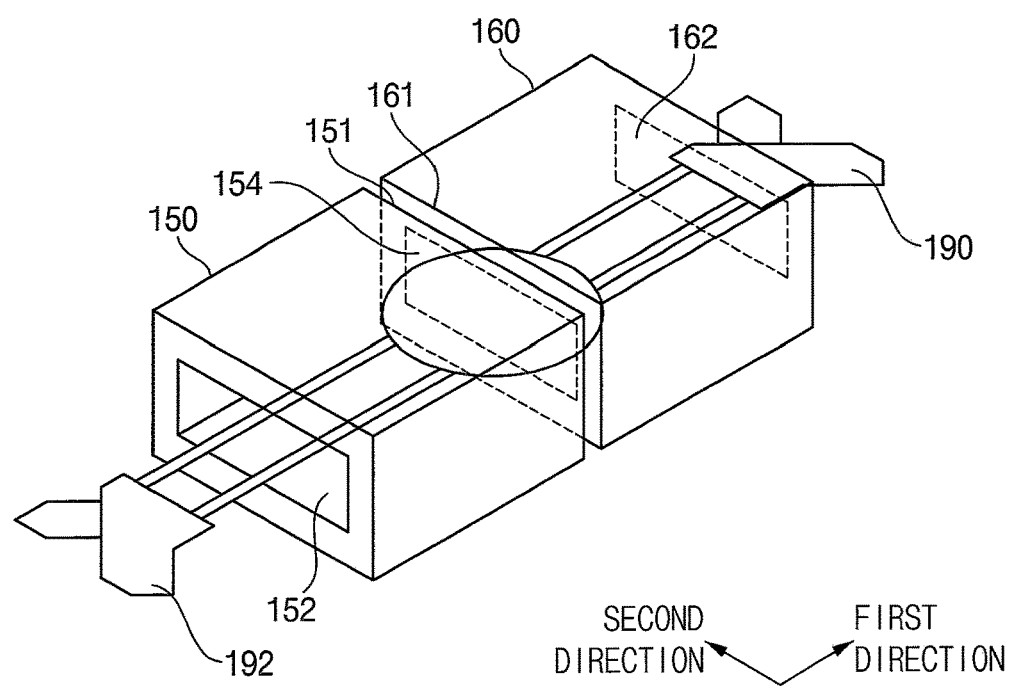

FIG. 10 is a plan view illustrating an apparatus for processing a substrate in accordance with example embodiments, and FIG. 11 is a perspective view illustrating operations for transferring the substrate between a wet chamber and a dry chamber of the apparatus in FIG. 10.

An apparatus 100b for processing a substrate in accordance with this example embodiment may include elements substantially the same as those of the apparatus 100 in FIG. 1 except for the inclusion of a second transfer robot. Thus, the same reference numerals may refer to the same elements and any further illustrations with respect to the same elements may be omitted herein in the interest of brevity.

Referring to FIG. 10, a second transfer robot 192 may be configured to load the semiconductor substrate into the wet chamber 150. Particularly, the wet chamber 150 may include a loading opening 152. The loading opening 152 may be formed through the sidewall of the wet chamber 150 opposite to the first connection opening 154. A loading shutter 170 may open and close the loading opening 152.

A loading region 130 may be arranged at a front of the loading opening 152 of the wet chamber 150. The second transfer robot 192 may be moved in the loading region 130 along the second direction. Further, the second transfer robot 192 may be moved from the loading region 130 to the wet chamber 150 along the first direction. A second cleaner 182 for cleaning the second transfer robot 192 may be arranged at a side of the loading region 130.

The second transfer robot 192 may function to load the semiconductor substrate into the wet chamber 150. Thus, the first transfer robot 190 may not have the function for loading the semiconductor substrate into the wet chamber 150. That is, the first transfer robot 190 may receive the semiconductor substrate processed by the chemical from the second transfer robot 192 through the first and second connection openings 154 and 164. The first transfer robot 190 may be backwardly moved to load the semiconductor substrate into the dry chamber 160 from the wet chamber 150. The first transfer robot 190 may unload the dried semiconductor substrate into the unloading region 140 from the dry chamber 160. Therefore, the first transfer robot 190 may have a summed length of the length of the unloading region 140 and the length of the dry chamber 160 along the second direction.

Alternatively, the wet chamber 150 and the dry chamber 160 of the apparatus 100b may include the sharing sidewall 155 in FIG. 9.

Figure 12:
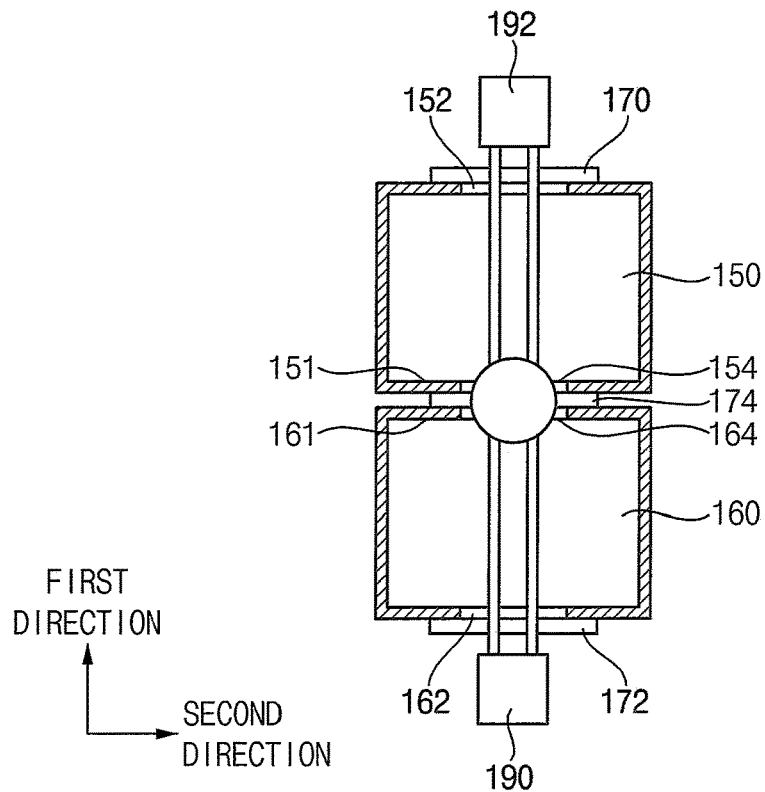

FIG. 12 is a plan view illustrating operations for loading the substrate into a wet chamber of the apparatus in FIG. 10.

Referring to FIG. 12, the second transfer robot 192 may be moved into the standby region 110 from the loading region 130 along the second direction to hold or pick up the semiconductor substrate. The second transfer robot 192 may be positioned at the front of the loading opening 152 of the wet chamber 150.

The loading shutter 170 may open the loading opening 152. The second transfer robot 192 may be moved into the wet chamber 150 through the loading opening 152 to load the semiconductor substrate into the wet chamber 150.

The second transfer robot 192 may be backwardly moved to be positioned in the loading region 130. The loading shutter 170 may close the loading opening 152. The semiconductor substrate in the wet chamber 150 may be processed using the chemical. For example, the wet process including the developing process, the wet etching process, the wet cleaning process, etc., may be performed on the semiconductor substrate.

Figure 13:
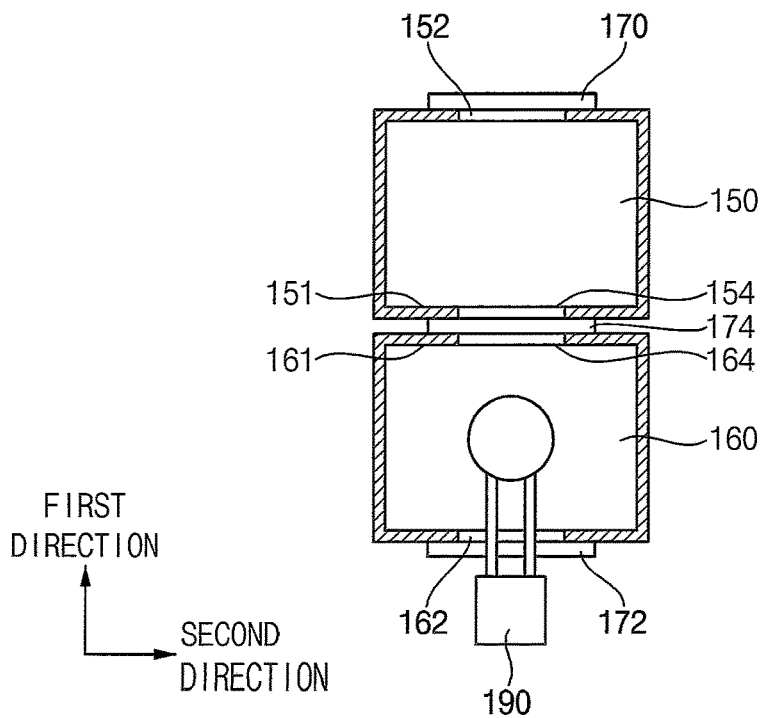

FIG. 13 is a plan view illustrating operations for loading the substrate into a dry chamber from a wet chamber of the apparatus in FIG. 10.

Referring to FIG. 13, after completing the wet process, the sharing shutter 174 may open the first connection opening 154 and the second connection opening 164. The first transfer robot 190 may be forwardly moved into the wet chamber 150 to receive the semiconductor substrate from the second transfer robot 192. The first transfer robot 190 may then load the semiconductor substrate into the dry chamber 160 through the first connection opening 154 and the second connection opening 164. The movement of the semiconductor substrate from the wet chamber 150 to the dry chamber 160 may be performed in a very short time so that the exposure time of the semiconductor substrate to the atmosphere may be very short or the semiconductor substrate may almost not be exposed to the atmosphere. Thus, the generation of the fume from the photoresist pattern and the chemical may be suppressed.

The first transfer robot 190 may be backwardly moved through the unloading opening 162. The first transfer robot 190 may then be positioned in the unloading region 140. The unloading shutter 172 may close the unloading opening 162. The drying process may be performed on the semiconductor substrate in the dry chamber 160 to dry the chemical.

After completing the drying process, the unloading shutter 172 may open the unloading opening 162. The first transfer robot 190 may be forwardly moved into the dry chamber 160 to hold the semiconductor substrate. The first transfer robot 190 may then unload the dried semiconductor substrate into the standby region 110.

According to example embodiments, the connection opening(s) may be formed through the sharing sidewall or adjacent sidewalls facing each other of the wet chamber and the dry chamber. The first transfer robot may transfer the substrate between the wet chamber and the dry chamber through the connection opening(s). Thus, an exposure time of the substrate to the atmosphere during transferring the substrate from the wet chamber to the dry chamber may be remarkably reduced to decrease generations of contaminants from the chemical.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. An apparatus for processing a substrate, the apparatus comprising:
    a wet chamber configured to perform a wet process on the substrate using a chemical;
    a dry chamber adjacent the wet chamber and configured to dry the substrate processed by the wet chamber;
    a first transfer robot configured to transfer the substrate between the wet chamber and the dry chamber; and
    a shared shutter between the wet chamber and the dry chamber,
    wherein the substrate is moved through a connection opening formed between the wet chamber and the dry chamber, and the shared shutter is configured to open and close the connection opening,
    wherein the wet chamber and the dry chamber are arranged in a first direction,
    wherein the first transfer robot is on an unloading region adjacent the dry chamber, and
    wherein the first transfer robot is movable on the unloading region in a second direction perpendicular to the first direction.

2. The apparatus of claim 1, wherein the wet chamber and the dry chamber share one side wall with each other through which the connection opening is formed, wherein the shared sidewall comprises a first surface in communication with the wet chamber and a second, opposite surface in communication with the dry chamber.

3. The apparatus of claim 1, wherein the connection opening comprises:
    a first connection opening formed through a side wall of the wet chamber that is adjacent the dry chamber; and
    a second connection opening formed through a side wall of the dry chamber that is adjacent the wet chamber.

4. The apparatus of claim 1, wherein the dry chamber comprises an unloading opening through which the substrate is unloaded, and an unloading shutter is configured to open and close the unloading opening.

5. The apparatus of claim 4, wherein the first transfer robot is configured to load the substrate into the wet chamber through the unloading opening and the connection opening.

6. The apparatus of claim 5, further comprising a first cleaner configured to clean the first transfer robot.

7. The apparatus of claim 1, wherein the wet chamber comprises a loading opening through which the substrate is loaded, and a loading shutter is configured to open and close the loading opening.

8. The apparatus of claim 7, further comprising a second transfer robot configured to load the substrate into the wet chamber through the loading opening.

9. The apparatus of claim 8, further comprising a second cleaner configured to clean the second transfer robot.

10. The apparatus of claim 1, further comprising a vision camera on the first transfer robot and configured to photograph a side surface of the substrate, an inner space of the wet chamber and an inner space of the dry chamber.

11. An apparatus for processing a substrate, the apparatus comprising:
    a wet chamber configured to perform a wet process on the substrate using a chemical;
    a dry chamber configured to share one sidewall with the wet chamber, a connection opening formed through the shared sidewall, and the dry chamber configured to dry the substrate transferred through the connection opening;
    a first transfer robot configured to transfer the substrate from the wet chamber to the dry chamber through the connection opening; and
    a shared shutter configured to open and close the connection opening,
    wherein the shared sidewall comprises a first surface in communication with the wet chamber and a second, opposite surface in communication with the dry chamber,
    wherein the wet chamber and the dry chamber are arranged in a first direction,
    wherein the first transfer robot is on an unloading region adjacent the dry chamber, and
    wherein the first transfer robot is movable on the unloading region in a second direction perpendicular to the first direction.

12. The apparatus of claim 11, wherein the dry chamber comprises an unloading opening through which the substrate is unloaded, and an unloading shutter is configured to open and close the unloading opening.

13. The apparatus of claim 12, wherein the first transfer robot is configured to load the substrate into the wet chamber through the unloading opening and the connection opening.

14. The apparatus of claim 11, wherein the wet chamber comprises a loading opening through which the substrate is loaded, and a loading shutter is configured to open and close the loading opening.

15. The apparatus of claim 14, further comprising a second transfer robot configured to load the substrate into the wet chamber through the loading opening.

16. The apparatus of claim 11, further comprising a vision camera on the first transfer robot and configured to photograph a side surface of the substrate, an inner space of the wet chamber and an inner space of the dry chamber.

17. An apparatus for processing a substrate, the apparatus comprising:
    a wet chamber configured to perform a wet process on the substrate using a chemical;
    a dry chamber configured to dry the substrate processed by the wet chamber;
    a first transfer robot;
    a second transfer robot; and
    a shared shutter between the wet chamber and the dry chamber,
    wherein a first connection opening is formed through a sidewall of the wet chamber that is adjacent the dry chamber, a second connection opening is formed through a sidewall of the dry chamber that is adjacent the wet chamber, and the shared shutter is configured to open and close the first and second connection openings,
    wherein the wet chamber comprises a loading opening through which the substrate is loaded, and a loading shutter is configured to open and close the loading opening,
    wherein the dry chamber comprises an unloading opening through which the substrate is unloaded, and an unloading shutter is configured to open and close the unloading opening,
    wherein the second transfer robot is configured to load the substrate to the wet chamber through the loading opening,
    wherein the first transfer robot is configured to unload the substrate from the dry chamber through the unloading opening, and
    wherein the first transfer robot and the second transfer robot are configured to cooperate such that the first transfer robot receives the substrate from the second transfer robot at the first and second connection openings.

18. The apparatus of claim 17, further comprising a vision camera on the first transfer robot and configured to photograph a side surface of the substrate, an inner space of the wet chamber and an inner space of the dry chamber.

\* \* \* \* \*